(12) United States Patent
Horiguchi

(10) Patent No.: US 12,117,101 B2
(45) Date of Patent: Oct. 15, 2024

(54) VALVE FOR SEMICONDUCTOR MANUFACTURING DEVICE

(71) Applicant: Kitz SCT Corporation, Tokyo (JP)

(72) Inventor: Hajime Horiguchi, Ohta (JP)

(73) Assignee: KITZ SCT CORPORATION, Tokyo (JP)

( * ) Notice: Subject to any disclaimer, the term of this patent is extended or adjusted under 35 U.S.C. 154(b) by 0 days.

(21) Appl. No.: 17/972,801

(22) Filed: Oct. 25, 2022

(65) Prior Publication Data

US 2023/0140781 A1 May 4, 2023

(30) Foreign Application Priority Data

Oct. 29, 2021 (JP) ................................. 2021-177370

(51) Int. Cl.
*F16K 7/17* (2006.01)
*H01L 21/67* (2006.01)

(52) U.S. Cl.
CPC .......... *F16K 7/17* (2013.01); *H01L 21/67017* (2013.01)

(58) Field of Classification Search
CPC .............................. F16K 7/17; H01L 21/67017
See application file for complete search history.

(56) References Cited

U.S. PATENT DOCUMENTS

| | | | | |
|---|---|---|---|---|
| 5,779,224 A * | 7/1998 | Fukano | .................... | F16K 41/12 251/64 |
| 6,536,810 B2 * | 3/2003 | Fukano | .................... | F16K 41/12 285/331 |
| 6,575,187 B2 * | 6/2003 | Leys | .................... | F16K 31/1262 137/625.5 |
| 6,948,517 B2 * | 9/2005 | Fukano | .................... | F16K 7/16 251/63.5 |
| 9,328,829 B2 * | 5/2016 | Fukano | ............... | F16K 31/1221 |
| 10,989,317 B2 * | 4/2021 | Doi | ........................... | F16K 7/16 |
| 11,408,537 B2 * | 8/2022 | Doi | ........................... | F16K 1/54 |
| 2015/0129791 A1 * | 5/2015 | Okita | ........................ | F16K 7/14 251/331 |

FOREIGN PATENT DOCUMENTS

| | | | | |
|---|---|---|---|---|
| CN | 107061786 A | * | 8/2017 | |
| CN | 114396487 A | * | 4/2022 | |
| DE | 202018107064 U1 | * | 4/2020 | ......... F16K 27/0236 |
| JP | 6-94142 | | 4/1994 | |
| JP | 2020-63777 | | 4/2020 | |

OTHER PUBLICATIONS

CN-114396487-A, Machine Translation (Year: 2022).*
DE-202018107064-U1, Machine Translation (Year: 2020).*
CN-107061786-A, Machine Translation (Year: 2017).*

* cited by examiner

*Primary Examiner* — Daphne M Barry
(74) *Attorney, Agent, or Firm* — Wenderoth, Lind & Ponack, L.L.P.

(57) ABSTRACT

A valve for semiconductor manufacturing device is provided in which an excessive surface pressure to the valve seat is prevented to improve durability. The valve main body (1) has a duplexed structure in which, a load distributing member (10) is arranged in serial to the valve seat (7) inside of the opening/closing mechanism (8) of the valve main body (1) while a thrust produced by the opening/closing mechanism (8) is maintained, a fastening load required is received as being distributed to the valve seat (7) and the load distributing member (10).

11 Claims, 4 Drawing Sheets

VALVE FOR SEMICONDUCTOR MANUFACTURING DEVICE

BACKGROUND OF THE INVENTION

Field of the Invention

The present invention relates to valves for semiconductor manufacturing devices and, in particular, a high-pressure valve suitable for a fluid affecting a valve seat such as corrosive gas to flow with high pressure.

Description of the Related Art

In a semiconductor manufacturing process, various high-pressure fluids including corrosive gas are often used. The valve for a semiconductor manufacturing device that controls these fluids requires a strong fastening load for valve closing to reliably prevent leakage. For this reason, by way of example, in a high-pressure diaphragm valve, the valve seat for sealing is prone to receive damage because of its fastening load together with corrosiveness of a fluid. If the valve is continuously used in this state, the valve seat is plastically deformed to be progressively crushed and broken, and the high-pressure fluid penetrates from its surface or a damaged portion to make the valve seat more prone to be broken. If the seat is broken and peeled off, the flow path may be clogged with this seat to become blocked, or breakage of the seat may cause leakage at valve closing.

To prevent damage to the valve seat, in general, a seat material with high load-bearing ability may be used to enhance strength, or a fastening load applied to the valve seat at valve closing, that is, a thrust from the stem for pressurizing the diaphragm (valve disk) may be reduced. Also, an effective area of the valve seat, that is, a pressurized area of the valve seat from a diaphragm side (area in contact with the diaphragm) may be increased to decrease a surface pressure (load applied per unit area) to the valve seat, thereby suppressing this surface pressure to the load-bearing ability of the material of the valve seat or lower.

On the other hand, the metal diaphragm valve of Japanese Unexamined Patent Application No. 6-94142 is configured to have a cushioning body provided between the valve seat and the drive-side output shaft. In this diaphragm valve, when the output shaft is driven to a valve-closing direction, this output shaft causes the metal diaphragm to press-fit to the valve seat via the cushioning body, thereby mitigating the impact on the seal portion at valve closing by the cushioning body.

In the diaphragm valve of Japanese Unexamined Patent Application No. 2020-63777, a film-shaped diaphragm made of a resin material is provided. To the drive-side piston shaft (output shaft), a cushioning body made of an elastic rubber material is assembled so as to be positioned between this piston shaft and a center portion of the diaphragm. When the piston shaft is driven to a valve-closing direction, the force from this piston shaft is reduced by the cushioning body.

Meanwhile, the valve for use in a semiconductor manufacturing process is often utilized as combined and integrated with a plurality of other valves, a control device, and so forth. Thus, the valve of this type is desired to have a compact outer size so as not to occupy a space at its installation location as much as possible. In this case, with reduction in size of the valve, reduction in size (reduction in diameter) of the valve mechanism, that is, the valve seat, is also required. When the valve is a diaphragm valve, even if the diameter of the valve seat is reduced to decrease the pressurized area (area in contact) with the diaphragm, high seal performance is required to be exerted without leakage of the high-pressure fluid at valve closing.

BRIEF SUMMARY OF THE INVENTION

In the above-described valves, when a seat material with high load-bearing ability to prevent damage to the valve seat is used, if the valve is a diaphragm valve, a material for general use in semiconductor manufacturing, for example, a fluororesin such as PCTFE or PFA, is normally used in consideration of performance of chemical resistance to the fluid and, therefore, options are very scarce. Moreover, only by providing a valve seat by using a resin material such as a fluororesin as described above, the strong fastening load at valve closing cannot be sufficiently mitigated only by the characteristics of the material, and it is difficult to prevent damage to the valve seat.

On the one hand, to reduce the thrust from the stem to decrease the force applied to the valve seat, decreasing the thrust (fastening load) of the stem directly leads to a decrease of a pressure resistance limit of the valve, making it difficult to obtain a fastening force required to reliably prevent leakage of the high-pressure fluid. Thus, this valve is not suitable for high-pressure fluids against which valve closing and sealing are performed.

On the other hand, to increase the effective area (pressurized area) of the valve seat to decrease the surface pressure on the valve seat, the diameter of the valve seat is enlarged to an outer diameter direction to enlarge the area in order to maintain a predetermined flow path diameter to ensure a flow rate. In this case, a problem arises in which, with an increase of the outer diameter of the valve seat, a gap between a flow path on this valve seat side and a flow path on the other side is widened to increase the outer size. In addition to this, when the valve is a diaphragm valve, the outer diameter of the diaphragm is also increased, and the thrust of the stem for reliable fastening is also increased with respect to the effective area of this diaphragm.

Also, the diaphragm valves of Japanese Unexamined Patent Application No. 6-94142 and Japanese Unexamined Patent Application No. 2020-63777 have a structure in which the cushioning body is interposed in series between the valve seat and the output shaft. At the time of fastening at valve closing, in any cases, the thrust from the output shaft side is absorbed by the cushioning body, and this thrust is decreased and transferred to the valve seat. Thus, when these valves are used as high-pressure valves for semiconductor manufacturing, sufficient seal capability cannot be exerted, and leakage may occur when a high-pressure fluid is let flow.

Moreover, in both of the above-described cases, when the valve is provided in a compact manner in accordance with integration or the like, the diameter of the valve seat is also decreased accordingly, thereby decreasing the area of contact with a valve disk side (for example, diaphragm). With this decrease of the seal area, an excessive surface pressure is applied to the valve seat when a strong thrust corresponding to the high-pressure fluid acts from a stem side, and this makes the valve seat prone to damage. When the valve seat receives damage exceeding its load-bearing ability, this valve seat may be crushed or broken, possibly leading to clogging of a flow path, leakage, or the like.

From these reasons, to let a fluid such as corrosive gas flow with high pressure at valve opening and reliably inhibit leakage of this high-pressure fluid at valve closing, the thrust from the stem side is strongly ensured so as not to impair seal capability. On the other hand, the occurrence of damage to the valve seat has to be tolerated.

The present invention was developed to solve the above-described problems, and has an object of providing a valve for semiconductor manufacturing device excellent in corrosion resistance, in which, while an increase of the diameter of the valve seat is prevented to maintain overall compactness, a thrust required for preventing leakage of a high-pressure fluid is exerted to allow sealability at valve closing to be ensured, and an excessive surface pressure to the valve seat is prevented to improve durability.

To achieve the object described above, a first aspect of the present invention is directed to a valve for a semiconductor manufacturing device which opens or closes in accordance with contact or non-contact between a diaphragm and a valve seat provided in a valve main body, wherein the valve main body is provided with an opening/closing mechanism which pressurizes the diaphragm to cause valve closing, a load distributing member is provided inside the opening/closing mechanism, the load distributing member is arranged so that a portion provided contiguously to the opening/closing mechanism and the load distributing member have a predetermined gap therebetween when the load distributing member is in parallel with the valve seat and in a valve-open state, the valve main body has a duplexed structure in which, while a thrust produced by the opening/closing mechanism is maintained, a fastening load required at valve closing is received as being distributed to the valve seat and the load distributing member.

A second aspect of the present invention is directed to the valve for a semiconductor manufacturing device, in which the load distributing member is provided to a portion not in contact with a fluid in a flow path of the valve main body.

A third aspect of the present invention is directed to the valve for a semiconductor manufacturing device, in which the load distributing member is a resin-made, ring-shaped load distributing seat or a disc spring having spring characteristics.

A fourth aspect of the present invention is directed to the valve for a semiconductor manufacturing device, in which the opening/closing mechanism comprises a piston or a spring of an actuator when the valve is an automatic valve, and is a stem provided to a handle when the valve is a manual valve.

A fifth aspect of the present invention is directed to the valve for a semiconductor manufacturing device, in which the load distributing member is arranged at a position where the thrust from the piston or the spring of the actuator or the stem provided to the handle is applied simultaneously with a time when the diaphragm and the valve seat make contact with each other.

According to the first aspect of the present invention, the load distributing member provided inside the opening/closing mechanism is provided in parallel with the valve seat, and is arranged so that the portion provided contiguously to the opening/closing mechanism and the load distributing member have a predetermined gap therebetween in a valve-open state. The valve main body has a duplexed structure in which a fastening load required at valve closing is received as being distributed to the valve seat and the load distributing member. Thus, while an increase of the diameter of the valve seat is prevented, this valve seat is attached to the valve main body to maintain overall compactness. At valve closing, a thrust required for preventing leakage of a high-pressure fluid can be exerted to allow sealability at valve closing to be ensured. Also, by preventing an excessive surface pressure to the valve seat, durability can be improved to prevent damage to the valve seat. In this case, with the valve seat made of a resin material excellent in chemical resistance being provided to improve corrosion resistance, by using the load distributing member provided as being made of an elastic material, it is possible to distribute the fastening load to ensure durability.

According to the second aspect of the present invention, the load distributing member to which the thrust from the opening/closing mechanism is applied is provided to the portion not in contact with the fluid in the flow path of the valve main body. Thus, this load distributing member is less prone to influences by corrosive gas, heat, and so forth, and its functionalities can be maintained. With this, even if the valve seat is softened by influences of corrosive gas, heat, and so forth, the thrust from the opening/closing mechanism can be reliably transferred via the load distributing member. By the load distributing seat receiving the load in this manner, sinking of the valve seat because of being crushed, a decrease of the seal height, or destruction of the valve seat is prevented to maintain excellent seal performance.

According to the third aspect of the present invention, a resin-made, ring-shaped load distributing seat or a disc spring having spring characteristics can be provided as the load distributing member. By providing a load distributing seat made of a resin material such as a fluororesin, corrosion resistance and chemical resistance can be improved. On the other hand, by providing a disc spring as the load distributing member, while the thrust produced by the opening/closing mechanism is maintained, the load can be mitigated to improve durability.

According to the fourth aspect of the present invention, the opening/closing mechanism is provided by using the piston or the spring of the actuator or the stem provided to the valve. Thus, the present invention can support both an automatic valve and a manual valve, and can provide a valve in which overall compactness is maintained, while the thrust required at valve closing is maintained to ensure sealability.

According to the fifth aspect of the present invention, the load distributing member is prevented from first making contact with the piston or the spring of the actuator or the stem provided to the handle to produce leakage. Also, the load is inhibited from being first applied to the valve seat to cause damage. The thrust produced at valve closing is applied as being distributed to each of the load distributing seat and the valve seat. Thus, the burden on the valve seat can be reliably suppressed to a pressure resistance limit of the material configuring this valve seat or lower. Alternatively, a valve seat made of a low-strength material can be provided.

DETAILED DESCRIPTION OF THE INVENTION

In the following, embodiments of a valve for semiconductor manufacturing device in the present invention are described in detail based on the drawings.

Figure 1:
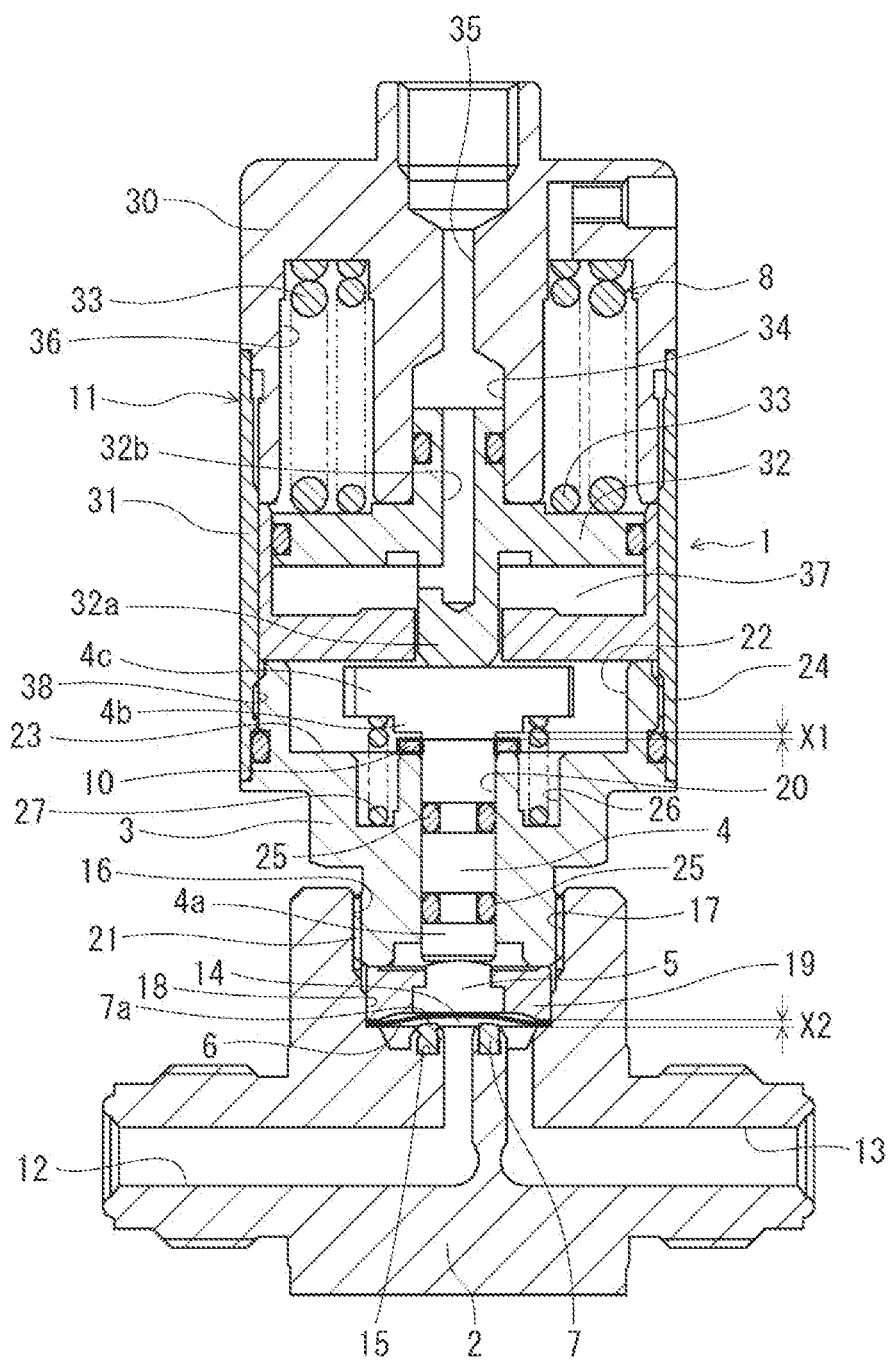
FIG. 1 is a central longitudinal sectional view of an embodiment of a valve for semiconductor manufacturing device in the present invention.

FIG. 1 depicts an embodiment of a valve for a semiconductor manufacturing device (hereinafter referred to as a valve main body 1) of the present invention. In the drawing, the valve main body 1 is formed of an automatic valve, and includes a body 2, a base body 3, a stem member 4, a diaphragm piece 5, a diaphragm 6, and a valve seat 7. The valve main body 1 is a valve for a semiconductor manufacturing device formed of a diaphragm valve which opens or closes in accordance with contact or non-contact between the diaphragm 6 and the valve seat 7. This valve main body 1 is provided with an opening/closing mechanism 8 which pressurizes the diaphragm 6 to cause valve closing. Inside this opening/closing mechanism 8, a load distributing member 10 is provided.

The valve main body 1 includes an actuator 11 provided on an upper portion. By this actuator 11, the valve main body 1 is provided so as to be controllable to open and close by automatic operation.

In FIG. 1, a primary flow path 12 and a secondary flow path 13 are provided in a left direction and a right direction, respectively, of the body 2 of the valve main body 1. Between the primary flow path 12 and secondary flow path 13, a valve chamber 14 is provided. Inside the valve chamber 14, an annular attachment groove 15 is formed. On an upper side of the valve chamber 14, an opening 16 is provided. On an inner circumferential side of an upper portion of the opening 16, a female thread 17 is formed. Between a portion on a lower side of the female thread 17 and the valve chamber 14, a circular-hole-shaped fitting-in portion 18 is formed.

The valve seat 7 is formed in a ring shape made of a fluororesin such as a resin material, for example, PCTFE (polychlorotrifluoroethylene), PFA (copolymer of tetrafluoroethylene and perfluoroalkoxyethylene), or the like. With a seal surface 7a at a tip side protruding to a valve chamber 14 side so as to be sealable by the diaphragm 6, the valve seat 7 is inserted into the attachment groove 15. The valve seat 7 is arranged so as to be opposed to the diaphragm 6 to control a flow of the fluid.

The diaphragm 6 is configured with a plurality of sheets made of a thin-plate-shaped metal material stacked together, and is provided so as to have a disk shape with a moderate convex curve surface toward one side (upward) with a center portion as an apex in a natural state. This shape has a self-restorable resilient force. The diaphragm 6 is inserted into the fitting-in portion 18 on an upper portion side of the valve seat 7.

In an upper portion of the diaphragm 6, a bonnet 19 formed in a cylindrical shape fits through the fitting-in portion 18. At the center of this bonnet 19, the diaphragm piece 5 formed in a substantially columnar shape is insertably attached so as to be slidable in a vertical direction. The diaphragm piece 5 is provided so as to be movable by the stem member 4 in the vertical direction with respect to the bonnet 19. Via this diaphragm piece 5, the diaphragm 6 is pressurized to a valve seat 7 direction.

The base body 3 has a through hole 20 at the center, and has a male thread 21 screwable into the female thread 17 formed on an outer circumferential side of a lower portion of the through hole 20. On an upper portion of the base body 3, a circular recessed groove 22 is formed. This recessed groove 22 is provided with a closed bottom surface portion 23. On the other hand, a male thread portion 24 is formed on the outer circumference of the upper portion of the base body 3. With the diaphragm 6, the bonnet 19, and the diaphragm piece 5 attached between the base body 3 and the body 2, the base body 3 is attached to an upper portion of the bonnet 19 by screwed attachment between the male thread 21 and the female thread 17. After this screwed attachment, the bonnet 19 is pressurized by the bottom surface side of the base body 3 and, by this bonnet 19, the diaphragm 6 is positioned and fixed at a predetermined location between the bonnet 19 and the body 2.

The stem member 4 is provided to have a shape including a shaft portion 4a formed on a lower portion side, a diameter-enlarged step portion 4b with its diameter slightly enlarged from this shaft portion 4a, and a diameter-enlarged annular portion 4c with its diameter further enlarged from this diameter-enlarged step portion 4b. The shaft portion 4a is insertably attached into the through hole 20 as being sealed with an O ring 25, thereby allowing the stem member 4 to ascend and descend with respect to the base body 3. A lower end side of the stem member 4 abuts on an upper end face side of the diaphragm piece 5. With ascending/descending movement of the stem member 4, the diaphragm 6 pressurizes the valve seat 7 via the diaphragm piece 5.

Between the diameter-enlarged annular portion 4c and an annular attachment groove 26 formed on an outer diameter side of the through hole 20, a coil spring 27 is attached in a spring-back state. By this spring 27, the stem member 4 is always pressed upward with respect to the base body 3.

The actuator 11 has a substantially cylindrical cover 30, an annular casing 31, a piston 32, and a coil-shaped spring 33. In a lower portion of the center of the cover 30, a guide hole 34 is formed. On an upper portion of this guide hole 34, an air supply and exhaust port 35 is formed so as to communicate therewith. On an outer diameter side of the guide hole 34, an annular attachment groove 36 is formed. In this attachment groove 36, the spring 33 is provided so as to be able to be inserted therein.

In the guide hole 34, a diameter-reduced shaft 32a formed on the piston 32 is insertably attached. Between the piston 32 and the attachment groove 36, the spring 33 is insertably attached. On an outer circumferential side of a lower portion of the cover 30, the inner circumference of the casing 31 is integrated by screwing. Between the piston 32 and the casing 31, a cylinder chamber 37 to which compressed air is supplied is provided. On an inner circumferential side of a lower portion of the casing 31, a female thread portion 38 is formed.

The actuator 11 is attachably fixed to and integrated with the base body 3 by screwing between the female thread portion 38 and the male thread portion 24. After assembling of the actuator 11, the piston 32 is attached, with its lower end face side abutting on an upper surface side of the diameter-enlarged annular portion 4c, so as to be able to reciprocate in the vertical direction. This piston 32 is provided so as to be able to descend with respect to the casing 31 by being pressed by the spring-back force of the spring 33. Also, the piston 32 is provided so that compressed air can be supplied from the air supply and exhaust port 35 via a flow path hole 32b formed in the piston 32 to the cylinder chamber 37 and, by this compressed air, the piston 32 can ascend against the spring-back pressing force of the spring 33.

Figure 2A:
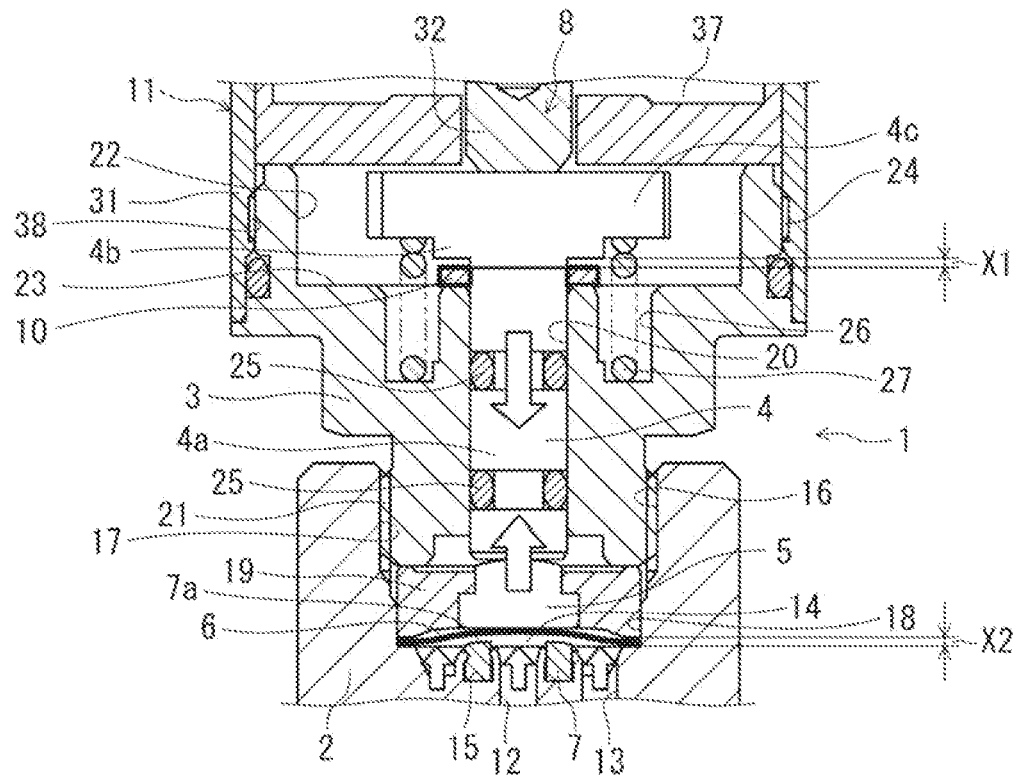
FIG. 2A is an enlarged sectional view of main portions of FIG. 1.
Figure 2B:
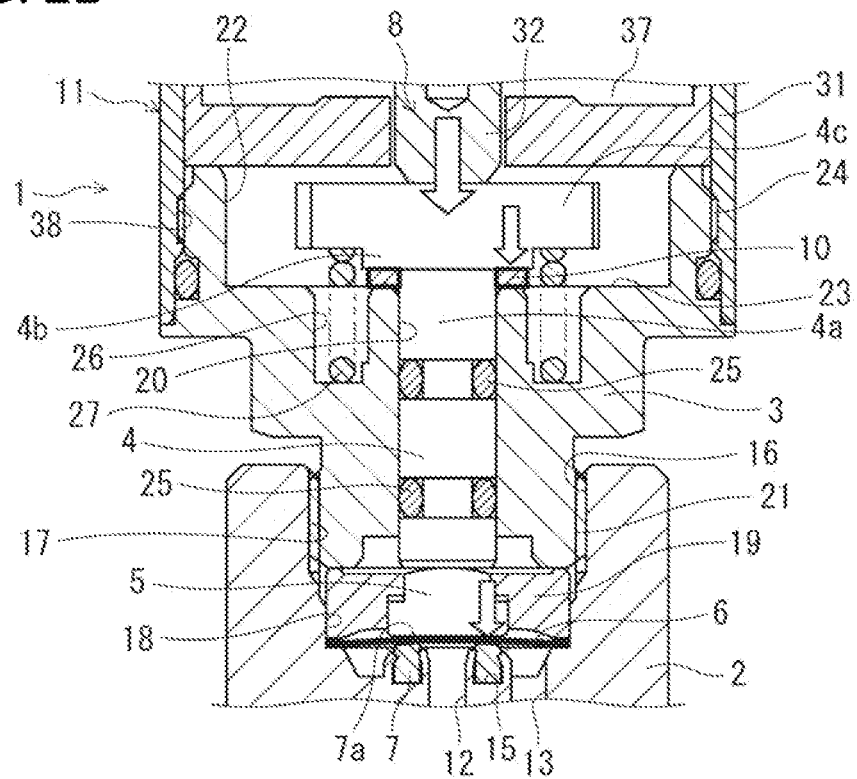
FIG. 2B is an enlarged sectional view of the main portions in a valve-closed state of FIG. 2A.

With this structure, when the piston 32 descends at the time of stopping of the supply of compressed air in FIG. 2B, the stem member 4 is pressurized downward by this piston 32 to pressurize the diaphragm 6 via the diaphragm piece 5, and a valve-closed sealed state occurs when this diaphragm 6 is seated on the valve seat 7. On the other hand, when the piston 32 ascends at the time of supplying of the compressed air in FIG. 2A, pressurization to the diaphragm 6 by the stem member 4 and the diaphragm piece 5 is released, and the diaphragm 6 is returned by the above-described self-restorable force to have the convex curve surface with the center portion as an apex, thereby going away from the valve seat 7 to cause a valve-open state.

In the case of an automatic valve using the actuator of the present embodiment, the above-described opening/closing mechanism 8 comprises the piston 32 or the spring 33 of the actuator 11 and, by these piston 32 and spring 33, a thrust is produced to cause the diaphragm to perform valve-opening or valve-closing operation.

The thrust produced from the opening/closing mechanism 8 is represented by thrust [N]=pressurized area [mm$^2$]× pressure [MPa]. Based on this relational expression, the thrust is transferred from the piston 32 to the stem member 4. In the above-mentioned relational expression, the pressurized area is a total area where the thrust is applied, and the pressure is a force applied per unit area of the pressurized area.

The load distributing member 10 arranged inside the opening/closing mechanism 8 is formed of a load distributing seat formed in a ring shape made of an elastic material such as, for example, fluororesin such as PCTFE or PFA, nylon, or a resin material such as ABS. In the present embodiment, the load distributing seat 10 is formed by using a fluororesin.

The load distributing seat 10 is attached between the diameter-enlarged step portion 4b of the stem member 4, which is a portion provided contiguously to the opening/closing mechanism 8 (piston 32, spring 33) and the bottom surface portion 23 of the base body 3, as being placed on the bottom surface portion 23. This load distributing seat 10 allows distribution of the load from the piston 32 (stem member 4).

In this case, with the diaphragm 6 tightly attached between the body 2 and the bonnet 19 to seal against the fluid, the load distributing seat 10 is in a state of being arranged at a portion not in contact with the fluid in the flow paths (the primary flow path 12, the secondary flow path 13, and valve chamber 14) of the valve main body 1.

The load distributing seat 10 is provided in a parallel state with respect to the valve seat 7. Also, in a valve-open state, the load distributing seat 10 and the above-described portion provided contiguously to the opening/closing mechanism 8 (the diameter-enlarged step portion 4b of the stem member, the bottom surface portion 23 of the base body) are arranged so as to have a predetermined gap X1 depicted in FIG. 2A formed therebetween. In the present embodiment, the load distributing seat 10 and the valve seat 7 are attached so as to be parallel to each other.

On the other hand, on a diaphragm 6 attachment side, in a valve-open state, the bottom surface side of the diaphragm 6 and the seal surface 7a of the valve seat 7 are provided so as to have a predetermined gap X2 formed therebetween, which is a stroke of the diaphragm 6.

The gap X1 and gap X2 in a valve-open state have a relation of gap X1=gap X2. In valve-closing operation, the diaphragm 6 abuts on (is seated on) the valve seat 7 and, at the same time, an abutting side of the diameter-enlarged step portion 4b makes contact with the load distributing seat 10, and the thrust from the piston 32 and the spring 33 of the actuator 11 is applied also to the load distributing seat 10.

Thus, the valve main body 1 has a duplexed structure in which, while a thrust produced by the opening/closing mechanism 8 is maintained, a fastening load required at valve closing is received as being distributed to the valve seat 7 and the load distributing seat 10.

When the above-described load distributing seat 10 and the valve seat 7 are provided, it is required to split (distribute) the load transferred from the piston 32 to both the load distributing seat 10 and the valve seat 7 in a balanced manner. Thus, it is required to set the dimensions of both of the seats 7 and 10 in consideration of the range of elastic deformation, mechanical tolerance range after arrangement, and so forth.

For example, at the time of valve closing, when the diameter-enlarged step portion 4b makes contact with the load distributing seat 10 before the diaphragm 6 is seated on the valve seat 7, a valve-closed sealed state does not occur and leakage of the fluid occurs. On the other hand, when the diaphragm 6 is seated on the valve seat 7 before the diameter-enlarged step portion 4b makes contact with the load distributing seat 10, the entire load by the piston 32 concentrates on this valve seat 7 from a diaphragm 6 side. In either of these cases, the load cannot be distributed by the duplexed structure by the valve seat 7 and the load distributing seat 10.

In addition to this, it is difficult to make a dimensional error due to variations in mechanical processing to be zero. Thus, in consideration of process tolerance and so forth, it is required to design a balanced and effective arrangement so that the diameter-enlarged step portion 4b makes contact with the load distributing seat 10 in an allowable range of elastic deformation of the valve seat 7.

When these seats 7 and 10 are provided, firstly, area allocation when each of the seats 7 and 10 receives a load is set, and the thickness on a valve seat 7 side (height of the seal surface 7a) is set based on the hardness of the load distributing seat 10 and a ratio of elastically deformable dimensions with respect to a thickness direction. Also, as required, the thickness of the load distributing seat 10 may be designed so as to be sufficiently large. The reason for these is that, by setting a large thickness of the valve seat 7, an expansion range in which the valve seat 7 can be safely elastically deformed can be increased and, furthermore, even if the thickness of the load distributing seat 10 is increased, the range of elastic deformation can be similarly increased.

As described above, by increasing the thickness of the load distributing seat 10 and the valve seat 7, it is possible to prevent leakage from occurring because the load distributing seat 10 first makes contact with the stem member 4 to cause the load to concentrate on this portion to make valve closing incomplete, or to prevent the load from concentrating on this valve seat 7 to cause damage because the diaphragm 6 first makes contact with the valve seat 7.

As a specific example, for example, when these seats 7 and 10 are made of PCTFE, and when elastic deformation in the load range not exceeding the limit of pressure resistance of this PCTFE is set at 10% at maximum, and the stacking error between the valve seat 7 and the load distributing seat 10 in a height direction occurring due to complex influences of process tolerance and assembling error of the diaphragm 6 and the stem member 4 is ±0.1 mm (0.2 mm as a width value), the material thickness of the valve seat 7 is provided to be equal to or larger than the width of this error 0.2 [mm]/10 [%]=2.0 mm.

If the thickness of the valve seat 7 cannot be sufficiently allocated due to some reason, in place of this valve seat 7, the thickness of the load distributing seat 10 is set similarly to the above. However, when the load distributing seat 10 is thickened, its range of elastic deformation is increased. Thus, when the valve seat 7 is softened, it is required to take it into consideration that the function of maintaining the thickness with respect to sinking of this valve seat 7 may become slightly decreased.

For example, if the load to be received by the load distributing seat 10 is constant irrespective of the thickness and the load distributing seat 10 is deformed by the load by 10%, 10% deformation when the thickness is 1.0 mm is 0.1 mm. Also, 10% deformation when the thickness is 2.0 mm is 0.2 mm. In comparison between these, a difference in deformation is 0.1 mm, and thus a difference in range of elastic deformation is widened. Thus, there is a possibility that a phenomena occurs in which when the valve seat 7 is softened, this valve seat 7 may sink too much.

Moreover, when the material of the load distributing seat 10 is set, it is required to consider material characteristics such as elasticity and hardness. Furthermore, other than this, it is also desirable to consider external environments such as the characteristics of components surrounding the arrangement position of the load distributing seat 10, such as the stem member 4 and the base body 3; affinity with grease to be applied inside; and use temperature of the valve main body 1, and so forth.

Note that the load distributing member 10 can be provided to any form, such as any of various materials except those made of resin, any of various shapes except a ring-shaped seat, and so forth. Although not depicted, a disc spring or a plate spring having spring characteristics can be used as the load distributing member, and any of these disc spring and plate spring can be attached between the diameter-enlarged step portion and the bottom surface portion (not depicted).

Also, with the duplexed structure in which the fastening load required at valve closing is received in a distributed manner by the load distributing member 10 and the valve seat 7 while the thrust is maintained, the load distributing member 10 may be configured to be fixed to a bottom surface portion 23 side of the base body 3 or a diameter-enlarged step portion 4b side of the stem member 4. Furthermore, the load distributing seat 10 is not limited to be between the stem member 4 and the base body 3, and can be provided at any position inside the valve main body 1.

When the load distributing seat 10 is provided, a difference in size can be provided between the gap X1 and the gap X2. With the duplexed structure in which the fastening load required at valve closing is distributed to the valve seat 7 and the load distributing seat 10, for example, the elastic force and/or material of the load distributing seat 10 or the shape, material, and/or the like of the diaphragm 6 may be set as appropriate and the gap X1 and the gap X2 may be set accordingly as appropriate.

While an example has been described in the present embodiment in which the present embodiment is applied to a diaphragm valve as a valve for a semiconductor manufacturing device, application of the present embodiment is not limited to the diaphragm valve, and the present embodiment can be applied to any of various valves such as, for example, those of a needle shape or a globe shape not depicted.

Next, the operation and action of the above-described embodiment of the valve for a semiconductor manufacturing device of the present invention are described.

In FIG. 1, FIG. 2A, and FIG. 2B, in the valve main body 1, the components such as the opening/closing mechanism 8, the stem member 4, the diaphragm piece 5, and the coil spring 27 operate in conjunction with the operation of the actuator 11 to transfer the produced thrust to the diaphragm 6 and the valve seat 7 to cause seal portions of these to be closely attached to cause a valve-closed or valve-open state, thereby allowing control of the flow of the fluid.

In FIG. 1 and FIG. 2A, when compressed air passes from the air supply and exhaust port 35 through the flow path hole 32b to the cylinder chamber 37, the piston 32 ascends by this compressed air against the spring-back pressing force of the spring 33. With this, pressurization to the diaphragm 6 by the stem member 4 and the diaphragm piece 5 is released, and the diaphragm 6 goes away from the valve seat 7 to cause a valve-open state.

In this case, the diameter-enlarged step portion 4b of the stem member 4, which is a portion provided contiguously to the opening/closing mechanism 8 (piston 32, spring 33) and the bottom surface portion 23 of the base body 3, and the load distributing seat are arranged so as to have the predetermined gap X1 formed therebetween, and no fastening load is applied from the piston 32. Thus, the thrust by the opening/closing mechanism 8 does not act on any of the load distributing seat 10 and the valve seat 7.

On a valve seat 7 side, the gap X2 having a height equal to that of the gap X1 is provided between this valve seat 7 and the diaphragm 6. This gap X2 reliably allocates flow paths, allowing the fluid to smoothly flow from the primary flow path 12 to the secondary flow path 13.

On the other hand, in FIG. 2B, when the supply of compressed air stops, a force causing the piston 32 to ascend is stopped. Also, by the spring-back pressing force of the spring 33, a force causing the piston 32 to descend acts. By the action of the forces of this piston 32, the stem member 4 and the diaphragm piece 5 are pressurized downward, and the diaphragm 6 is pressurized by the diaphragm piece 5. With this, the diaphragm 6 is seated on the valve seat 7 to cause a valve-closed sealed state.

As described above, with the duplex structure in which the fastening load required at valve closing is received in a distributed manner by the valve seat 7 and the load distributing seat 10 arranged separately from this valve seat 7 as a different member inside the opening/closing mechanism 8 in a parallel state while the thrust produced by the opening/closing mechanism 8 is maintained, it is possible, without changing the magnitude of the thrust by the fastening load of the piston 32 required at valve closing and sealing, to distribute pressure by this thrust to the valve seat 7 and the load distributing seat 10.

Here, since the valve seat 7 and the load distributing seat 10 are provided in a parallel state, from the above-described relational expression of thrust=pressurized area×pressure, it is possible to represent as follows: thrust by the piston 32=(pressurized area of the valve seat 7×pressure applied to the valve seat 7)+(pressurized area of the load distributing seat 10×pressure applied to the load distributing seat 10).

With this, while the surface pressure received by the valve seat 7 (load to be carried per unit area) is reduced to allow reduction of damage to be received by the valve seat 7, it is not required to decrease the thrust produced by the opening/closing mechanism 8, thereby exerting sufficient fastening capability also to a high fluid pressure. In this case, without decreasing the fastening force by the piston 32, it is possible to cause the thrust having a predetermined magnitude required to prevent leakage to act on the valve seat 7 and the load distributing seat 10, with each pressure (surface pressure) decreased. Compared with a case in which the load distributing seat 10 is not provided, a burden on the valve seat 7 is reduced. Thus, fluororesin, which is excellent in chemical resistance, is selected for the valve seat 7 and the load distributing seat 10, and the fastening load is mitigated without adding a superfluous load (thrust) from an actuator 11 side, thereby allowing prevention of damage to the valve seat 7 and the load distributing seat 10 and a failure of the valve main body 1.

Without increasing the size of this valve seat 7 to suppress the pressure on the valve seat 7 to increase the pressurized area, it is possible to prevent an increase in size of the valve main body 1 and also ensure compactness. It is also not required to limit the magnitude of the pressure of the fluid flowing inside the valve main body 1. By decreasing only the surface pressure (pressure) applied to the valve seat 7, the high-pressure fluid can flow while functionalities such as seal performance and flow-rate characteristics required for the valve main body 1 are ensured. With this, even when the valve main body 1 is provided in a compact manner by integration or the like, the fastening load is distributed with a duplexed structure for the diameter-decreased valve seat 7 to prevent an excessive surface pressure and improve durability.

Since the load distributing seat 10 is provided on a recessed groove 22 side which is not in contact with the fluid inside the valve main body 1, degradation and breakage of the load distributing seat 10 can be prevented. Thus, even if the valve seat 7 is softened by a corrosive fluid, it is possible for the load distributing seat 10 to bear the load borne by the valve seat 7 instead. This can prevent loss of seal capability due to continuous crush of the valve seat 7 and can provide the valve main body 1 with high durability capable of continuously performing normal operation against softening of the valve seat 7.

Even if a pressure is received in a direction of opening the valve by the fluid at the time of valve closing while designing is performed by calculating the spring load pushing the piston 32 and the specifications of air pressure for driving and so forth in advance, a natural valve-opening operation by the thrust produced from the piston 32 can be prevented. Note that a similar function can be applied also to a manual valve using a handle, which will be described further below and, in that case, the thrust produced from the handle is used as a fastening load and designing is performed by calculating a thread diameter and thread pitch provided to the handle in advance, thereby inhibiting a natural valve-opening operation.

When the valve main body 1 is provided, in particular, a valve for high pressure requires a larger fastening load so that operation is not inhibited by a high-pressure fluid, and it is thus required to set a large thrust of the piston 32. In this case, for example, when PCTFE is used as the material of the valve seat 7, the tensile strength of this PCTFE is known to be on the order of 41 MPa at maximum. When this value is taken as a limit value, if the valve seat 7 is singly provided without provision of the load distributing seat 10, there is a possibility that the valve seat 7 is plastically deformed to be crushed or destroyed when a surface pressure exceeding 41 MPa is applied to the valve seat 7. When the load distributing seat 10 is provided, the surface pressure is applied as being distributed to this load distributing seat 10, thereby making it possible to prevent application of a surface pressure exceeding 41 MPa to the valve seat 7.

Figure 3:
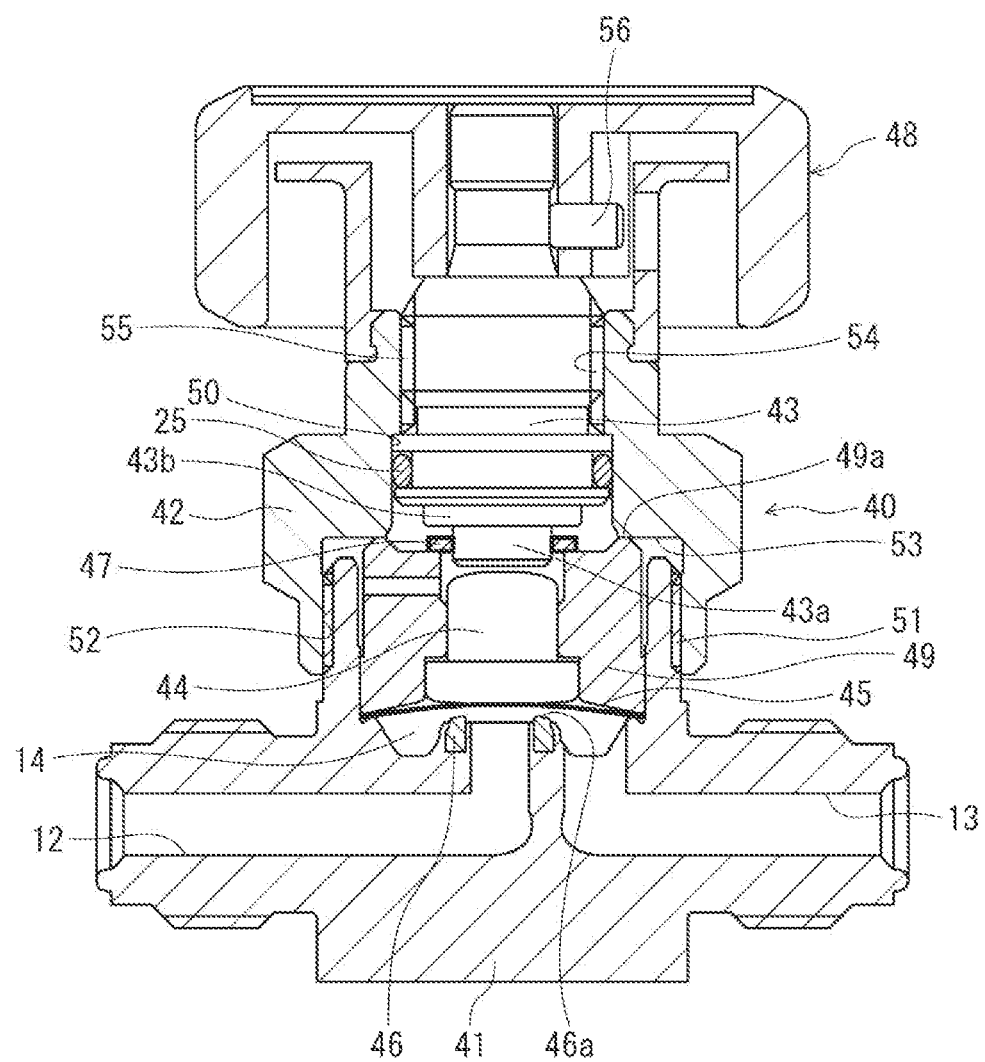
FIG. 3 is a central longitudinal sectional view of another embodiment of the valve for semiconductor manufacturing device in the present invention.
Figure 4A:
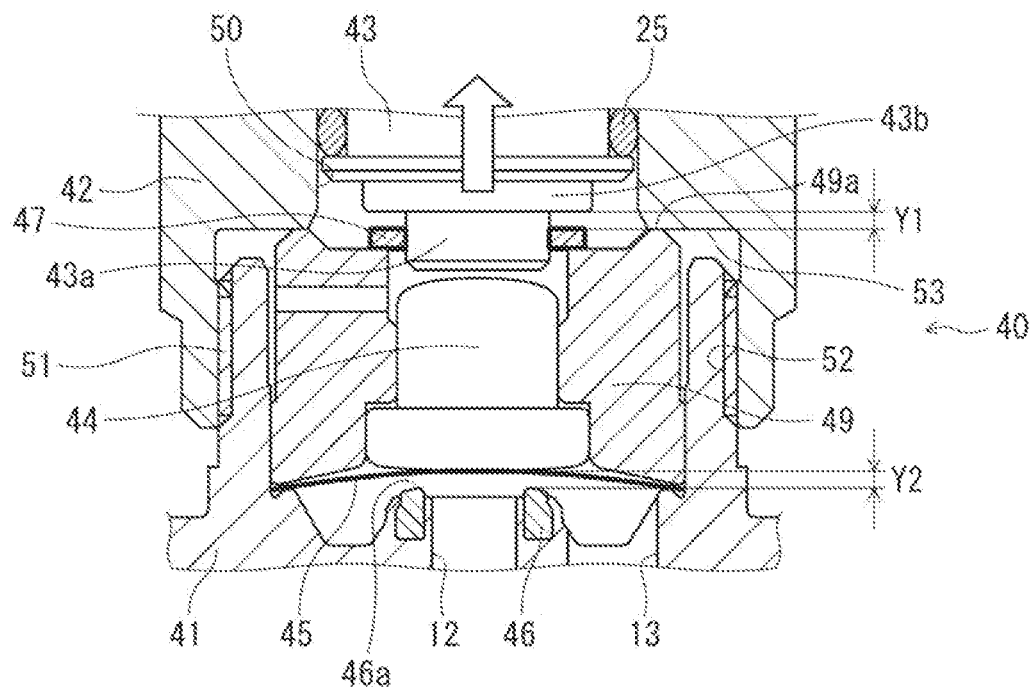
FIG. 4A is an enlarged sectional view of main portions of FIG. 3.
Figure 4B:
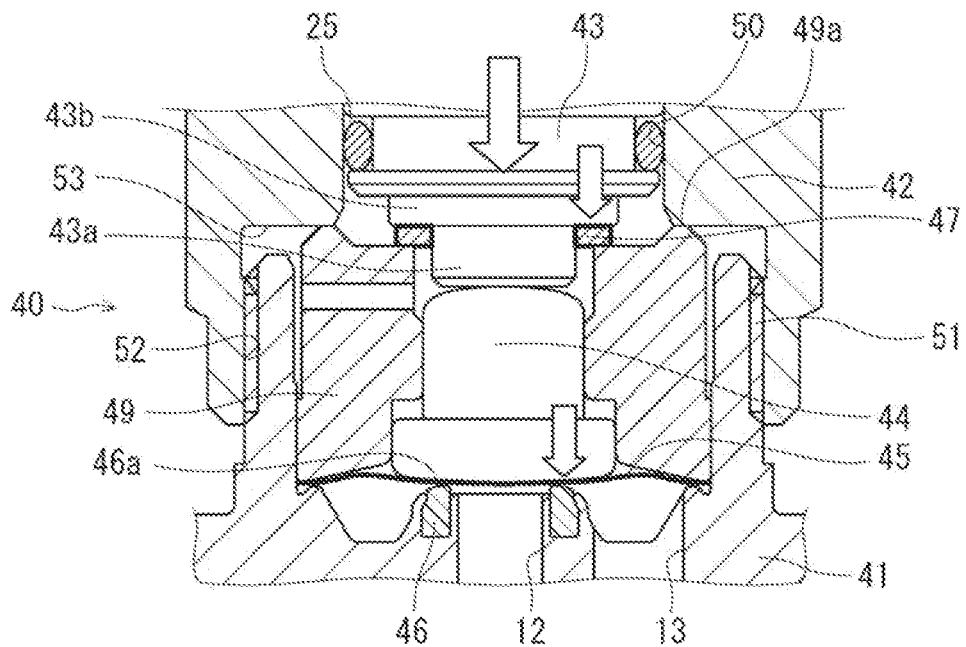
FIG. 4B is an enlarged sectional view of the main portions in a valve-closed state of FIG. 4A.

In FIG. 3, FIG. 4A, and FIG. 4B, another embodiment of the valve for semiconductor manufacturing device of the present invention is depicted. Note in this embodiment that portions identical to that of the above-described embodiment are indicated by the same reference characters, and a description of the identical portions is omitted.

A valve main body 40 of this embodiment is formed of a manual valve formed of a diaphragm valve including a body 41, a base body 42, a stem 43, a diaphragm piece 44, a diaphragm 45, a valve seat 46, a load distributing seat (load distributing member) 47, and a handle 48.

The valve main body 40 is provided with an opening/closing mechanism 43. This opening/closing mechanism 43 comprises a stem provided to the handle 48. Through this stem 43, the diaphragm 45 is pressurized to allow valve closing. At a predetermined position inside the body 41, the valve seat 46 is attached similarly to the above-described embodiment. With the diaphragm 45 being inserted from above this valve seat 46, the diaphragm piece 44 is attached to the body 41 via the bonnet 49.

The base body 42 is cylindrically formed, and has a through hole 50 formed at the center and a female thread 52 formed in a lower portion, the female thread 52 into which a male thread 51 formed on an upper portion of the body 41 is screwed. The base body 42 is integrated with the body 41 by screwing between the male thread 51 and female thread 52. Here, a pressurizing surface 53 provided on a bottom surface side of the inner circumference of the base body 42 pressurizes a bonnet upper surface 49a, and thus the bonnet 49 pressurizes the diaphragm 45 and the diaphragm 45 is positioned and fixed between the bonnet 49 and the body 41. On an upper portion side of the through hole 50, a female thread portion 54 is formed.

On the outer circumference of the stem 43, a male thread portion 55 which is screwed into the female thread portion 54 is formed. By screwing the male thread portion 55 and female thread portion 54, the stem 43 is attached so as to be in a state capable of ascending and descending with respect to the base body 42. On an upper end side of the stem 43, the handle 48 is fixed with a set screw 56. By operating the handle 48 for rotation, the stem 43 rotates integrally with this handle 48 to ascend and descend with respect to the base body 42. On a bottom surface side of the stem 43, a diameter-reduced protruding portion 43a is formed. On an upper portion side of this protruding portion 43a, a diameter-enlarged step portion 43b with its diameter further enlarged is formed. When the stem 43 is caused to descend, the protruding portion 43a pressurizes the diaphragm piece 44 and the diaphragm 45 to allow the flow paths to be closed. When the stem 43 is caused to ascend, the protruding portion 43a releases pressurization of the diaphragm piece 44 and the diaphragm 45 to allow the flow paths to be opened.

The load distributing seat 47 is attached as being positioned between the outer circumferential side of the stem protruding portion 43a and a bonnet upper surface 49a. With this, as with the above-described embodiment, the load distributing seat 47 is arranged in parallel with the valve seat 46.

In FIG. 4A, in a valve-open state in which the stem 43 as an opening/closing mechanism ascends, the diameter-enlarged step portion 43b as a portion provided contiguously to the opening/closing mechanism 43 and the load distributing seat 47 are arranged so as to have a predetermined gap Y1 formed therebetween.

Here, on a diaphragm 45 attachment side, in a valve-open state, the bottom surface side of the diaphragm 45 and a seal surface 46a of the valve seat 46 are open as having a gap Y2 formed therebetween, which is a stroke of the diaphragm 45. In a valve-open state, the gap Y1 and gap Y2 have a relation of gap Y1=gap Y2.

On the other hand, in FIG. 4B, a duplexed structure is provided, in which a thrust is produced when the handle 48 is rotated to cause the stem 43 to descend and, while this thrust is maintained, a fastening load required at valve closing can be received in a distributed manner by the valve seat 46 and the load distributing seat 47. That is, the load distributing seat 47 is arranged at a position where the thrust from the stem 43 provided to the handle 48 is applied when the diaphragm 45 and the valve seat 46 make contact with each other.

As described above, by applying the opening/closing mechanism 43 to a manual valve and distributing the fastening load to the valve seat 46 and the load distributing seat 47, a function similar to that of the above-described embodiment can be exerted. In particular, it is possible to prevent destruction or the like of the valve seat 46 by fastening the handle 48 too much and, in addition, even if a large thrust is designed, its influence on the valve seat 46 is suppressed as much as possible to allow sufficient seal capability to be maintained. Thus, shortages of each of sliding resistance between the bottom surface side of the protruding portion 43a and the diaphragm piece 44 and sliding resistance between the male thread portion 55 and the female thread portion 54, which are prone to occur when the fastening load is suppressed, are prevented from running short, and an occurrence of an inconvenience in closing and stopping by a return phenomenon of the handle 48 due to this shortage of this sliding resistance is also suppressed.

Examples

Next, examples when the valve seat and the load distributing seat of the valve for semiconductor manufacturing device are set are described.

In the valve main body 1 of the embodiment having the structure of FIG. 1, to compare between a case in which a fastening force (thrust) is received singly by the valve seat 7 without provision of the load distributing seat 10 and a case in which a thrust is provided by both of the load distributing seat 10 and the valve seat 7 in the above-described embodiment, the magnitudes of forces applied to the seats 7 and 10 in each case were calculated.

As a condition for a valve for high-pressure gas, for example, the valve main body 1 usable to a pressure of 20.6 MPa was provided. In this case, a design margin was set at 10%, an effective area of the diaphragm 6 was provisionally set at 88.4 mm², and a reactive force P produced by fluid pressure on the diaphragm 6 was set at P=88.4×20.6×1.1=2003 [N]. To pressurize the diaphragm 6 receiving this reactive force P to reliably cause valve-closing operation, the entire opening/closing mechanism 8 and each of the other components were designed so that a thrust F by the spring 33 exceeds the reactive force P, also in consideration of its spring load. Furthermore, the seal load produced by the thrust F at the time of valve closing was always applied continuously even if the supply of the fluid stopped and no internal pressure was produced.

The size of the seal surface 7a of the valve seat 7 for use in the above-described valve main body 1 was set at φ6.6 mm in outer diameter and φ3.6 mm in inner diameter, and its effective area was set at (6.6/2)²×π−(3.6/2)²×π≅24.0 mm².

Firstly, when only the valve seat 7 was provided without provision of the load distributing seat 10 inside the valve main body 1, the surface pressure by the reactive force P was 2003/24.0=83.5 [MPa] at maximum.

As described above, when the load distributing seat 10 was not provided, the result was that surface pressure (83.5 MPa) significantly exceeded 41 MPa indicating a load-bearing ability (tensile strength) of PCTFE described above. Thus, it was observed that after repeated use, there was a high possibility that the valve seat 7 was not able to withstand the surface pressure to become plastically deformed, damaged, or ruptured.

On the other hand, when the valve seat 7 and the load distributing seat 10 were provided in parallel, in addition to the valve seat 7 having a seal surface size (effective area) of 24.0 mm², the load distribution seat 10 having an effective area (area opposed to each of the diameter-enlarged step portion and the bottom surface portion) of 26.0 mm² was used. With this, a total of the effective areas of the valve seat 7 and the load distributing seat 10 (total area) became 50.0 mm².

From this, the surface pressure by the reactive force P (2003 [N]) to this total area of 50 mm² became 2003/50.0=40 [MPa].

When the load distributing seat 10 was provided as described above, for 41 MPa, which is a general load-bearing ability of PCTFE, the surface pressure received by the valve seat 7 falls within numerical values in a pressure resistance limit of the material. Thus, the valve seat 7 was able to be inhibited from being damaged.

Furthermore, damage to the valve seat 7 was able to be also reduced when corrosive gas or the like penetrated through the valve seat 7 to soften this valve seat 7.

For example, when the load-bearing ability of the valve seat 7 is decreased to 20.5 MPa (50% of 41 MPa, which is a general value) by a chemical agent or the like, if the load distributing seat 10 is not provided, the surface pressure of 83.5 MPa is applied only to the valve seat 7. Thus, a ratio between these is 83.5 [MPa]/20.5 [MPa]=4.1. Upon reception of this 4.1-fold surface pressure, it was observed that destruction or the like became prone to proceed.

By contrast, when the valve seat 7 and the load distributing seat 10 are both used, the surface pressure applied to the total area of these is 40 MPa. Thus, a ratio between this surface pressure and the load-bearing ability of the valve seat 7 is 40 [MPa]/20.5 [MPa]=1.95. Thus, by suppressing the surface pressure to 1.95 fold, damage was able to be significantly suppressed, compared with the case in which the load distributing seat was not provided.

Furthermore, in the above, the load distributing seat 10 was designed in consideration of relations with the thrust applied to the valve seat 7, the load-bearing ability thereof, and so forth. Specifically, a thrust limit of the valve seat 7 alone (thrust not causing plastic deformation) when the load-bearing ability of the valve seat 7 is decreased to 20.5 MPa is 24.0 [mm²]×20.5 [MPa]=492 [N], from the area of the seal surface (effective area)×pressure resistance after softening. Since the total thrust produced by the piston is 2003 [N], the thrust to be received by the valve seat 7 alone when the load distributing seat 10 is provided is 2003 [N]−492 [N]=1511 [N].

In contrast to this thrust, the surface pressure received by the load distributing seat 10 is 1511 [N]/26.0 [mm²]=58.1 [MPa]. Thus, the pressure resistance of the load distributing seat 10 was set to be larger than 58.1 MPa and, in the present example, MC Nylon (registered trademark) (load-bearing ability of 96 MPa) was used as a material. In this case, even if the valve seat 7 was softened and crushed, the load distributing seat was able to singly receive a relatively high load, thereby preventing deformation exceeding a range of elastic deformation of the valve seat 7, such as crush.

While the load distributing seat 10 was set as described above to appropriately distribute the thrust, the valve main body 1 was able to be manufactured with compactness being maintained, without design limitations being applied to the performance, product size, and so forth of the valve main body 1. Also, it was confirmed that the load-bearing ability of the valve seat 7 was not lost and its functionalities were not impaired.

While the embodiments of the present invention have been described in detail in the foregoing, the present invention is not limited to the description of the above embodiments and can be variously modified in a scope not deviating from the spirit of the invention described in the claims of the present invention.

What is claimed is:

1. A valve for a semiconductor manufacturing device, comprising:
    a valve main body; and
    a valve seat and a diaphragm provided in the valve main body, wherein the valve is configured to open or close in accordance with contact or non-contact between the diaphragm and the valve seat,
    wherein the valve main body is provided with an opening/closing mechanism which pressurizes the diaphragm to cause valve closing,
    wherein a load distributing member is provided inside the opening/closing mechanism, the load distributing member being arranged in parallel with the valve seat,
    wherein the load distributing member is arranged between a first planar surface of a portion provided contiguously to the opening/closing mechanism and a second planar surface that is opposite the first planar surface, the load distributing member being arranged on the second planar surface, such that when the valve is in an open state, a predetermined gap exists between the load distributing member and the first planar surface of the portion provided contiguously to the opening/closing mechanism, and such that when the valve is in a closed state, the first planar surface of the portion provided contiguously to the opening/closing mechanism directly contacts the load distributing member,
    wherein the load distributing member is arranged so as to be capable of expansion and contraction throughout its entire thickness in a loading direction, and such that an entirety of the load distributing member is capable of free expansion in a lateral direction in response to compression of the load distributing member in the loading direction, and
    wherein the valve main body has a duplexed structure in which, while a thrust produced by the opening/closing mechanism is maintained, a fastening load required at valve closing is received as being distributed to the valve seat and the load distributing member.

2. The valve for a semiconductor manufacturing device according to claim 1, wherein the load distributing member is provided to a portion of the valve main body which is not in contact with a fluid in a flow path of the valve main body.

3. The valve for a semiconductor manufacturing device according to claim 2, wherein the load distributing member is a resin-made, ring-shaped load distributing seat or a disc spring having spring characteristics.

4. The valve for a semiconductor manufacturing device according to claim 2, wherein the opening/closing mechanism includes a piston or a spring of an actuator when the valve is an automatic valve, or a stem provided to a handle when the valve is a manual valve.

5. The valve for a semiconductor manufacturing device according to claim 1, wherein the load distributing member is a resin-made, ring-shaped load distributing seat or a disc spring having spring characteristics.

6. The valve for a semiconductor manufacturing device according to claim 5, wherein the opening/closing mechanism includes a piston or a spring of an actuator when the valve is an automatic valve, or a stem provided to a handle when the valve is a manual valve.

7. The valve for a semiconductor manufacturing device according to claim 1, wherein the opening/closing mechanism includes a piston or a spring of an actuator when the valve is an automatic valve, or a stem provided to a handle when the valve is a manual valve.

8. The valve for a semiconductor manufacturing device according to claim 7, wherein the load distributing member is arranged at a position where thrust from the piston or the spring of the actuator, or thrust from the stem provided to the handle, is applied simultaneously with a time when the diaphragm and the valve seat make contact with each other.

9. The valve for a semiconductor manufacturing device according to claim 1, wherein the valve main body includes a base body, the second planar surface is a bottom surface portion of the base body, and an annular groove is formed in the base body, and
    wherein a coil spring is arranged in the annular groove so as to surround the load distributing member.

10. The valve for a semiconductor manufacturing device according to claim 9, wherein a laterally outer surface of the load distributing member directly faces a laterally inner surface of the coil spring.

11. The valve for a semiconductor manufacturing device according to claim 1, wherein the portion provided contiguously to the opening/closing mechanism includes a first portion having a first diameter and a second portion having a second diameter, the second diameter being smaller than the first diameter, and wherein the second portion includes the first planar surface of the portion provided contiguously to the opening/closing mechanism.

* * * * *